(12) United States Patent
Tanaka et al.

(10) Patent No.: US 11,145,607 B2
(45) Date of Patent: Oct. 12, 2021

(54) SEMICONDUCTOR CHIP

(71) Applicant: Murata Manufacturing Co., Ltd., Kyoto-fu (JP)

(72) Inventors: Yusuke Tanaka, Nagaokakyo (JP); Fumio Harima, Nagaokakyo (JP); Masayuki Aoike, Nagaokakyo (JP); Koshi Himeda, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 8 days.

(21) Appl. No.: 16/838,977

(22) Filed: Apr. 2, 2020

(65) Prior Publication Data
US 2020/0321289 A1 Oct. 8, 2020

(30) Foreign Application Priority Data

Apr. 4, 2019 (JP) .............................. JP2019-071794

(51) Int. Cl.
*H01L 23/58* (2006.01)
*H01L 23/66* (2006.01)
*H01L 23/00* (2006.01)

(52) U.S. Cl.
CPC .......... *H01L 23/562* (2013.01); *H01L 23/564* (2013.01); *H01L 23/585* (2013.01); *H01L 23/66* (2013.01); *H01L 24/16* (2013.01); *H01L 24/48* (2013.01); *H01L 2223/6655* (2013.01); *H01L 2224/16227* (2013.01); *H01L 2224/48227* (2013.01); *H01L 2924/1033* (2013.01); *H01L 2924/10271* (2013.01); *H01L 2924/10329* (2013.01); *H01L 2924/1421* (2013.01); *H01L 2924/30111* (2013.01); *H01L 2924/3512* (2013.01)

(58) Field of Classification Search
CPC ... H01L 23/562; H01L 23/564; H01L 23/585; H01L 23/66; H01L 24/16; H01L 24/48; H01L 2223/6655; H01L 2224/16227; H01L 2224/48227; H01L 2924/10271; H01L 2924/10329; H01L 2924/1033; H01L 2924/1421
USPC ....................................................... 257/778
See application file for complete search history.

(56) References Cited

U.S. PATENT DOCUMENTS

| 7,723,753 | B2 | 5/2010 | Sasaki et al. |
| 7,772,682 | B1 | 8/2010 | Zhang et al. |
| 8,344,504 | B2 | 1/2013 | Wholey et al. |

(Continued)

FOREIGN PATENT DOCUMENTS

JP 2008-227116 A 9/2008

*Primary Examiner* — Elias Ullah
(74) *Attorney, Agent, or Firm* — Studebaker & Brackett PC

(57) ABSTRACT

A semiconductor chip includes a compound semiconductor substrate having a pair of main surfaces and a side surface therebetween, a circuit on one main surface of the pair of main surfaces, and first metals on the main surface. The first metals are positioned, in plan view of the main surface, closer to an outer edge of the main surface than the circuit, substantially in a ring shape to surround the circuit with gaps between first metals adjacent to each other. The semiconductor chip further includes second metals on the main surface. The second metals are positioned, in plan view of the main surface, between the circuit and the first metals or closer to the outer edge than the first metals. Also, the second metals each are positioned, in plan view of the side surface, such that at least a part thereof overlaps a gap between the first metals.

20 Claims, 14 Drawing Sheets

(56) References Cited

U.S. PATENT DOCUMENTS

| | | |
|---|---|---|
| 9,460,840 B2 | 10/2016 | Altunkilic et al. |
| 2004/0150070 A1 | 8/2004 | Okada et al. |
| 2008/0224174 A1 | 9/2008 | Sasaki et al. |
| 2009/0140391 A1 | 6/2009 | Hou et al. |

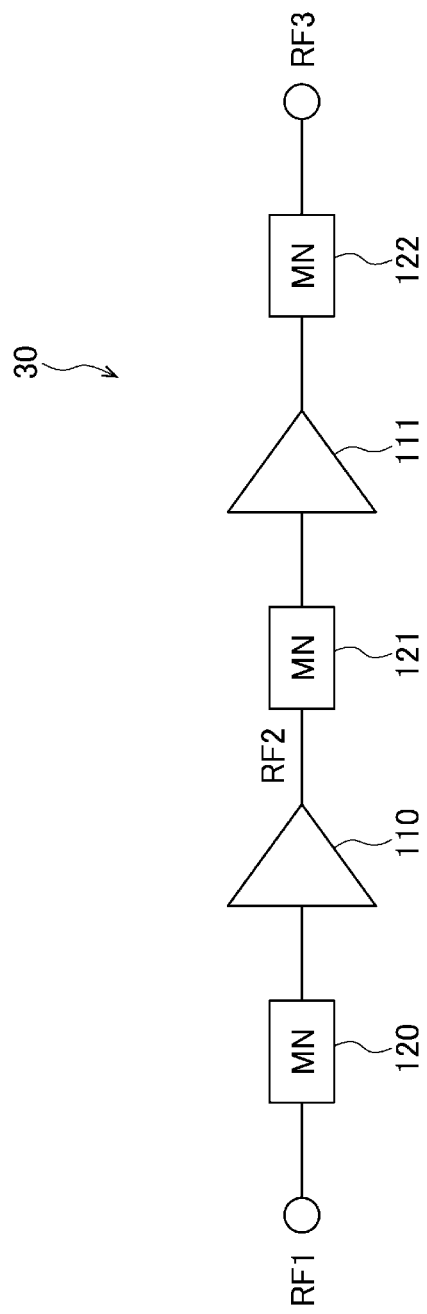

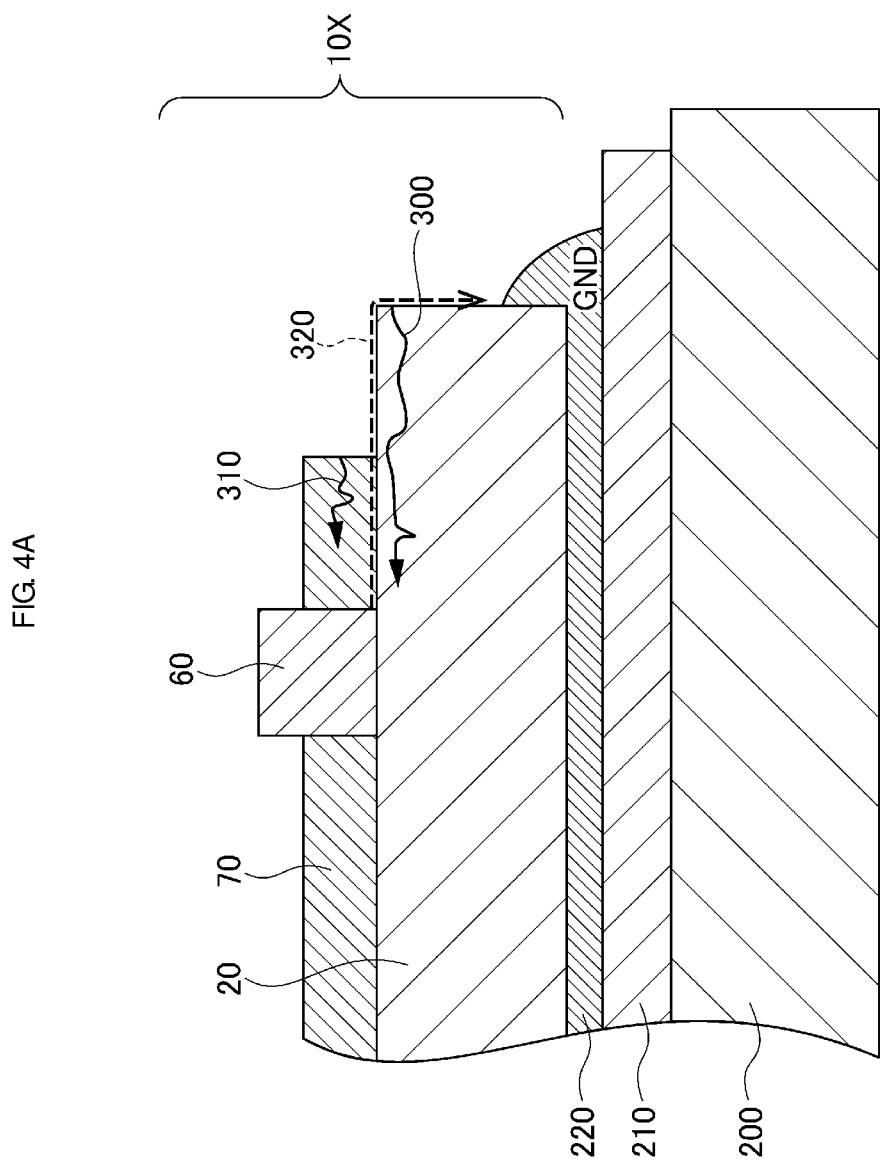

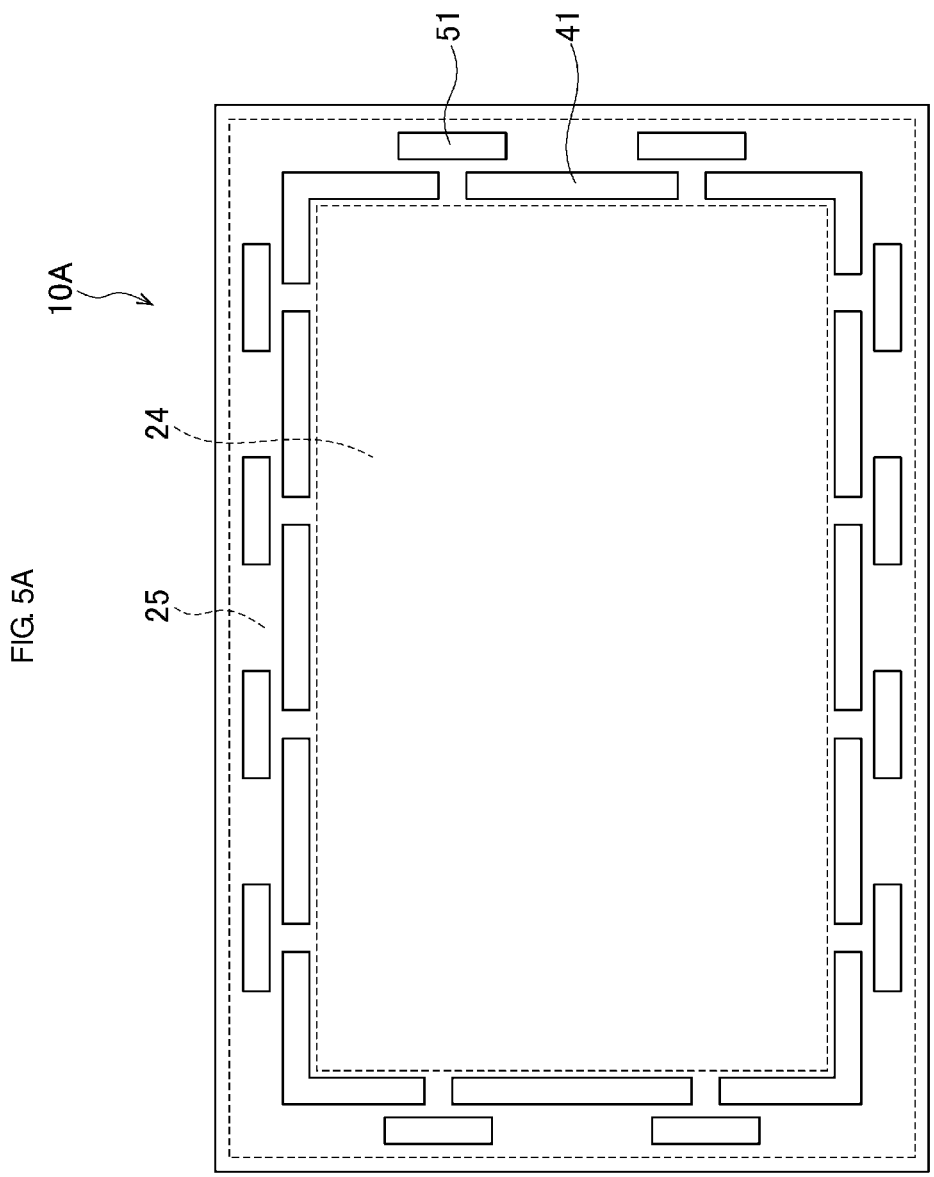

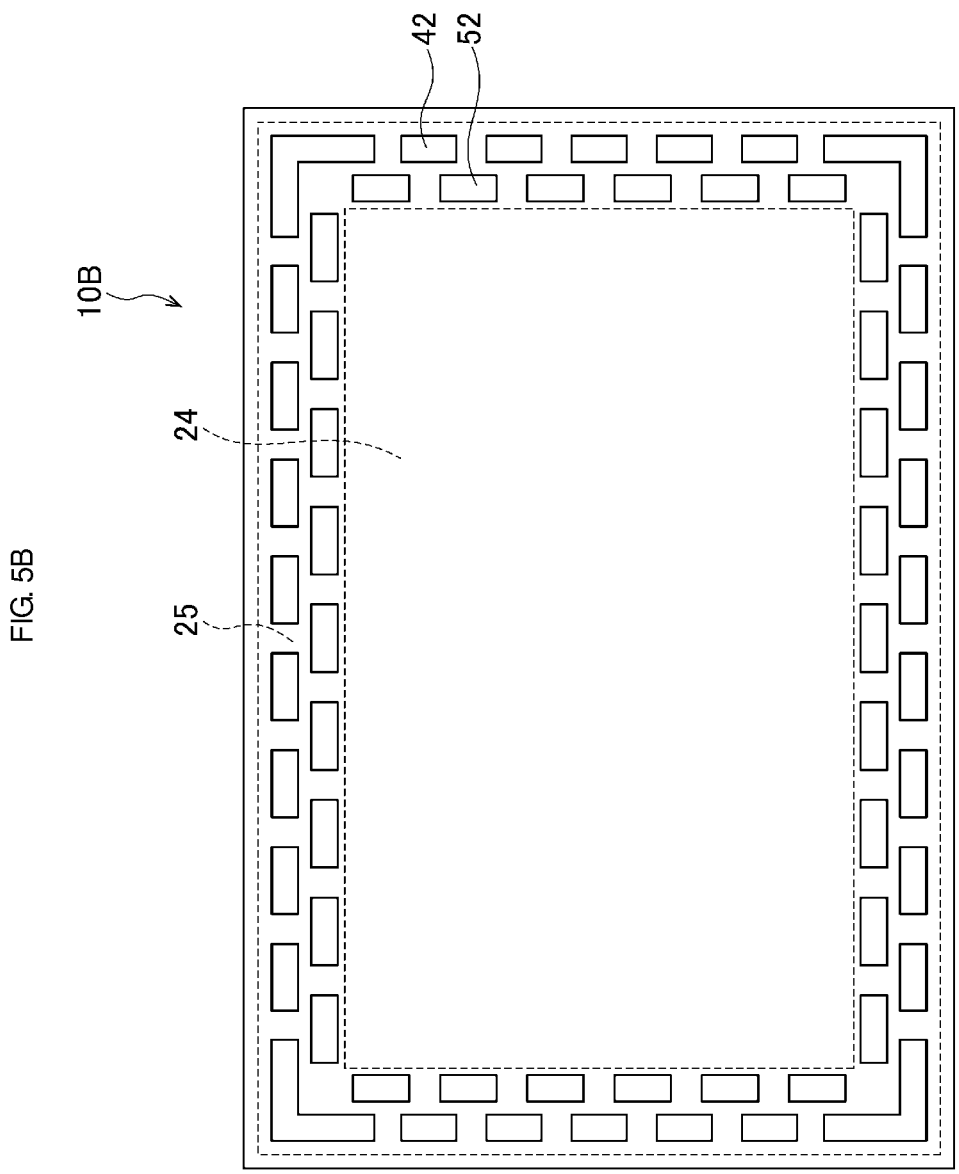

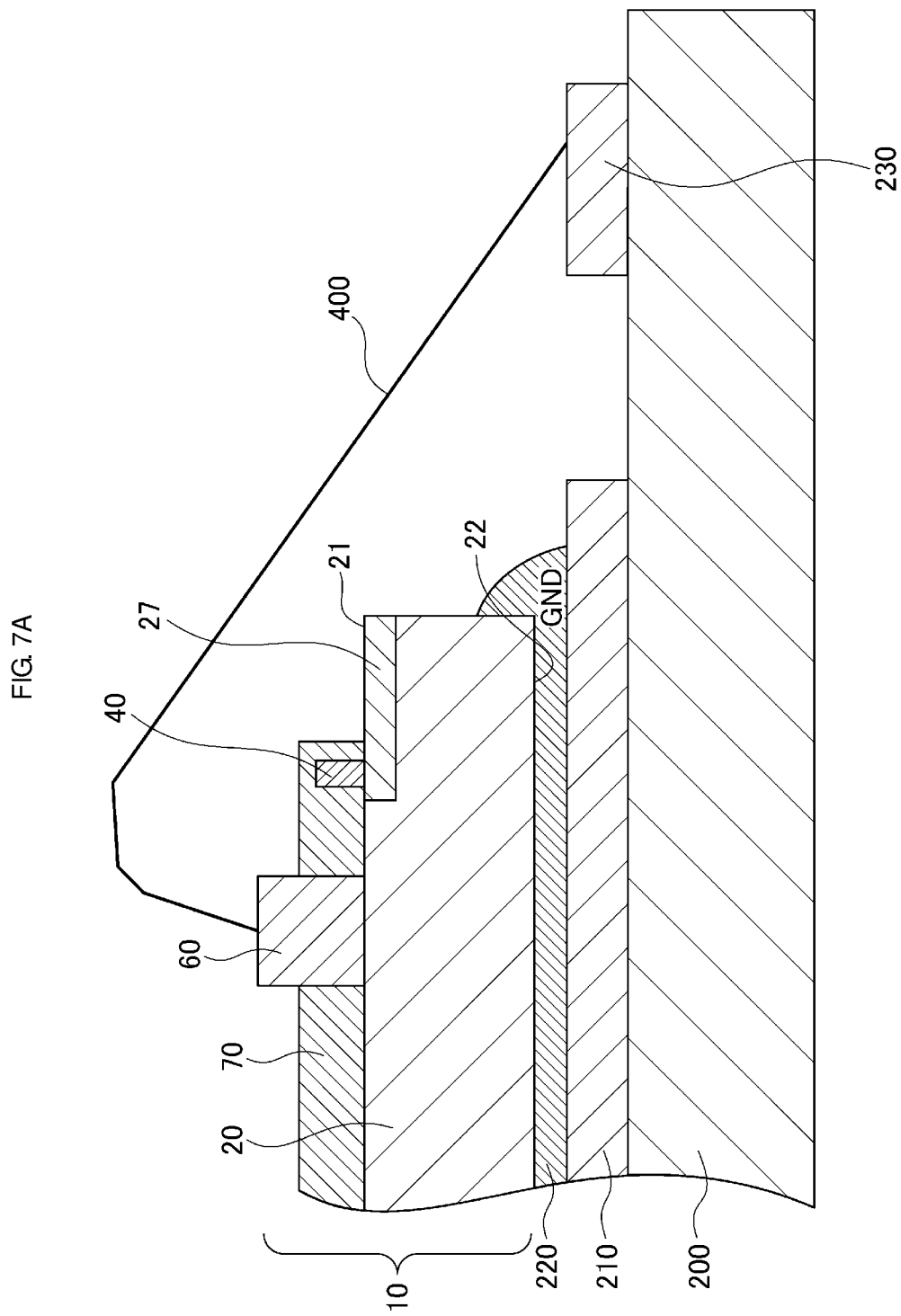

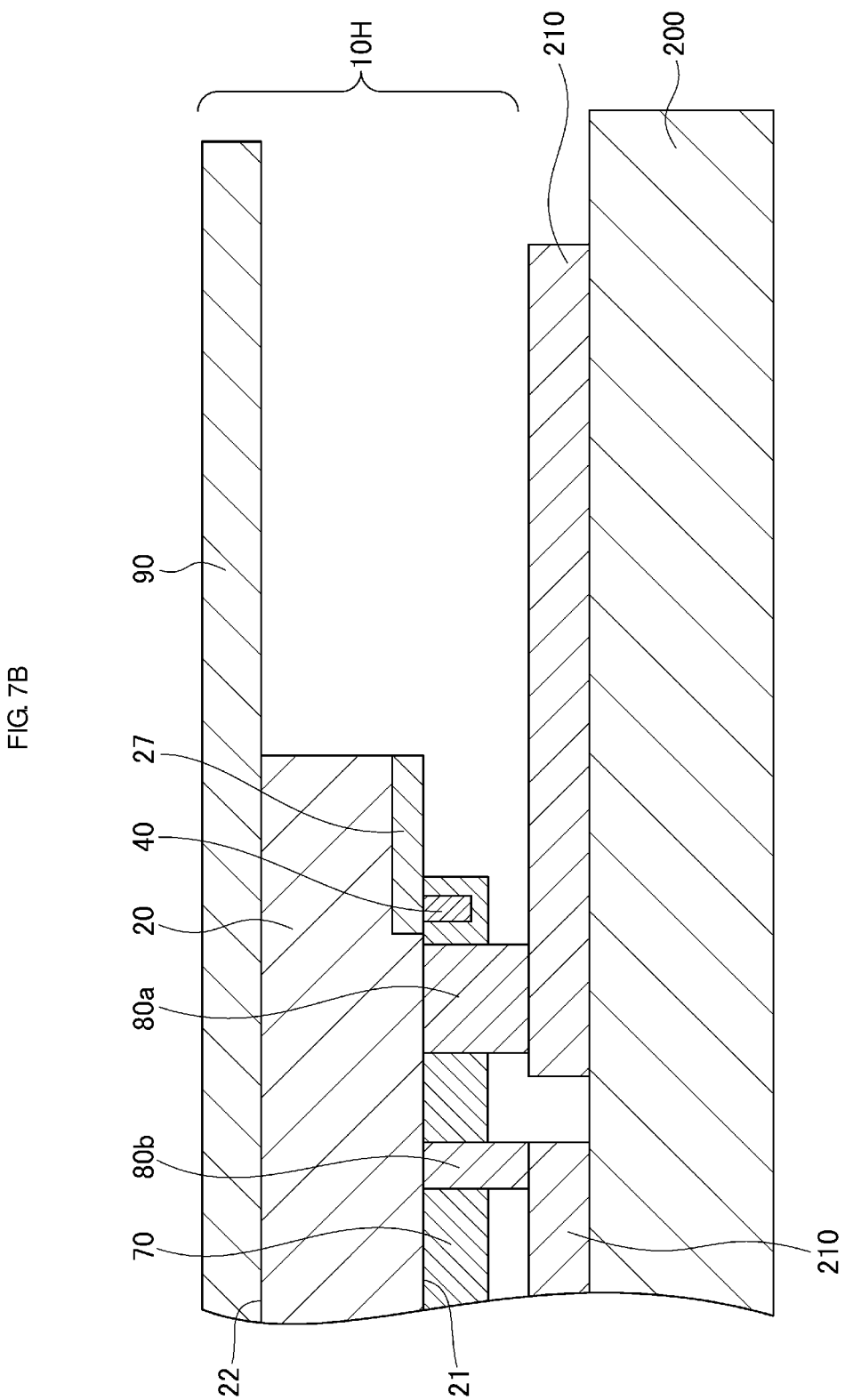

SEMICONDUCTOR CHIP

CROSS-REFERENCE TO RELATED APPLICATION

This application claims benefit of priority to Japanese Patent Application No. 2019-071794, filed Apr. 4, 2019, the entire content of which is incorporated herein by reference.

BACKGROUND

Technical Field

The present disclosure relates to a semiconductor chip.

Background Art

A known technology of a so-called sealing ring is one in which an outer periphery of a semiconductor chip is covered with a conductive layer in order to prevent impurities from entering the semiconductor chip. For example, Japanese Unexamined Patent Application Publication No. 2008-227116 discloses a semiconductor device in which a sealing ring is formed by exposing, in an outer peripheral portion of a substrate, a semiconductor layer that is the same as a semiconductor layer constituting a collector region of a bipolar transistor substantially in a ring shape. In the semiconductor device, entry of impurities is prevented because a decrease in adhesion between the exposed conductive layer and a protective film that protects a semiconductor chip is suppressed.

SUMMARY

Such a sealing ring can also be formed by disposing a metal on a semiconductor substrate substantially in a ring shape. However, for example, when a metal is formed on a gallium arsenide (GaAs) substrate by vapor deposition, it is difficult to form a pattern so as to have a completely closed ring-like shape. As a result, a gap may be generated in the metal. If a gap is generated in the metal and a crack is formed in the substrate or a protective film by, for example, application of stress from the outside of the semiconductor chip, the crack may enter from the gap of the metal and develop to the inside of the semiconductor chip.

The present disclosure has been made in view of the circumstances described above. Accordingly, the present disclosure provides a semiconductor chip in which development of a crack formed in a semiconductor substrate or a protective film can be suppressed.

A semiconductor chip according to an aspect of the present disclosure includes a compound semiconductor substrate having a pair of main surfaces and a side surface between the pair of main surfaces; a circuit on a first main surface of the pair of main surfaces; and a plurality of first metals on the first main surface. The plurality of first metals are positioned, in plan view of the first main surface, so as to be closer to an outer edge of the first main surface than the circuit, substantially in a ring shape so as to surround the circuit with gaps between first metals that are adjacent to each other. The semiconductor chip further includes a plurality of second metals on the first main surface, the plurality of second metals being positioned, in plan view of the first main surface, between the circuit and the plurality of first metals or so as to be closer to the outer edge than the plurality of first metals. Also, the plurality of second metals each are positioned, in plan view of the side surface of the compound semiconductor substrate, such that at least a part of the second metal overlaps a gap between the first metals.

According to preferred embodiments of the present disclosure, it is possible to provide a semiconductor chip in which development of a crack formed in a semiconductor substrate or a protective film can be suppressed.

Other features, elements, characteristics and advantages of the present disclosure will become more apparent from the following detailed description of preferred embodiments of the present disclosure with reference to the attached drawings.

BRIEF DESCRIPTION OF THE DRAWINGS

FIG. 3 is a circuit diagram of a power amplifier circuit formed on a compound semiconductor substrate illustrated in FIG. 1;

FIG. 4A is a sectional view illustrating the structure of a semiconductor chip according to a comparative example;

FIG. 5A is a plan view of a semiconductor chip illustrating a modification of the arrangement of metals;

FIG. 5B is a plan view of a semiconductor chip illustrating a modification of the arrangement of metals;

FIG. 7A is a sectional view illustrating a structure in which a semiconductor chip according to an embodiment of the present disclosure is mounted on an insulating substrate with a wire-bonding structure; and FIG. 7B is a sectional view illustrating a structure in which a semiconductor chip according to an embodiment of the present disclosure is mounted on an insulating substrate with a flip-chip structure.

DETAILED DESCRIPTION

Figure 1:
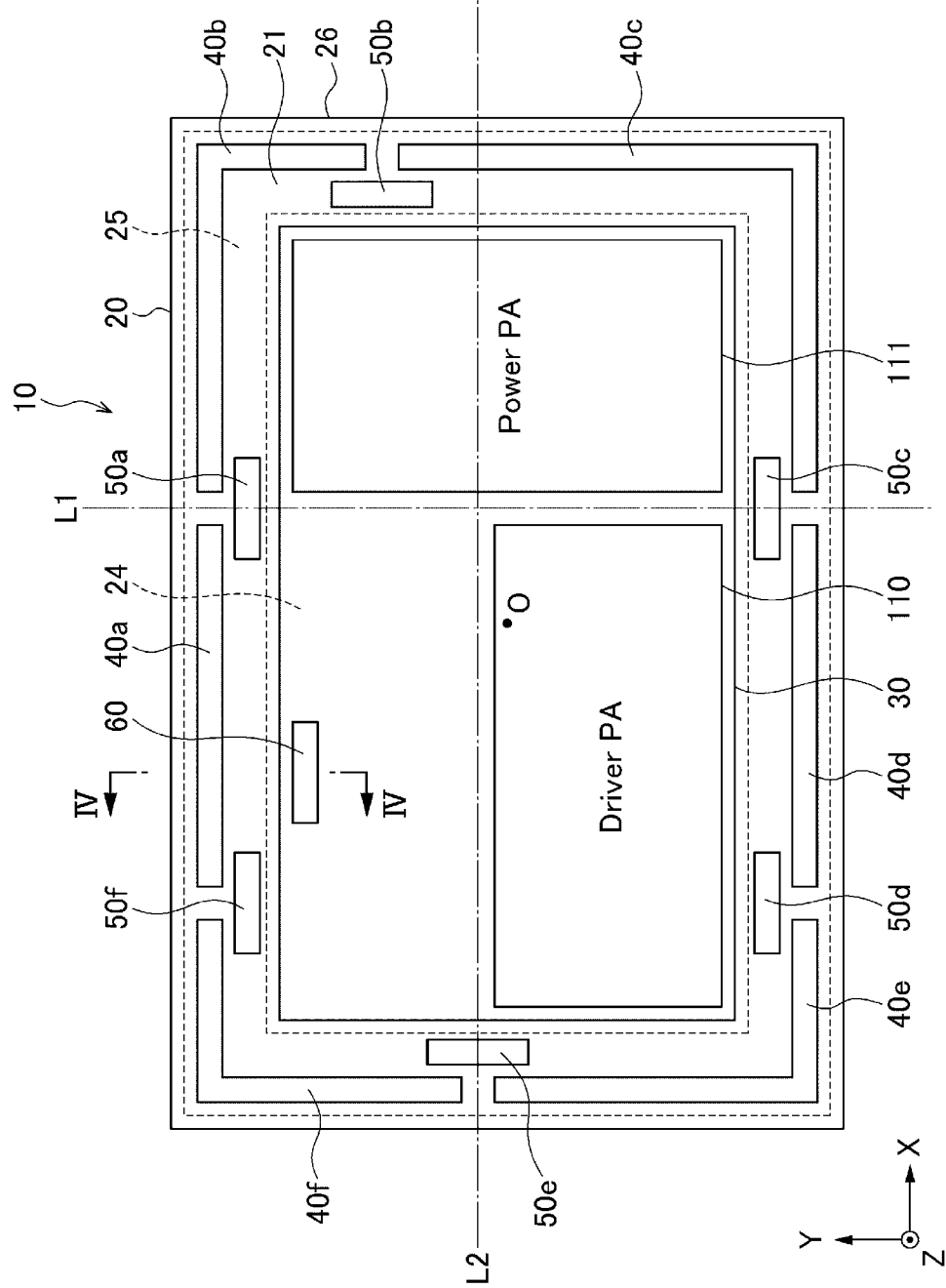
FIG. 1 is a plan view illustrating an example of the configuration of a semiconductor chip according to an embodiment of the present disclosure.

Hereafter, embodiments of the present disclosure will be described in detail with reference to the drawings. The same components are denoted by like reference numerals, and repeated description thereof is omitted.

Figure 2:
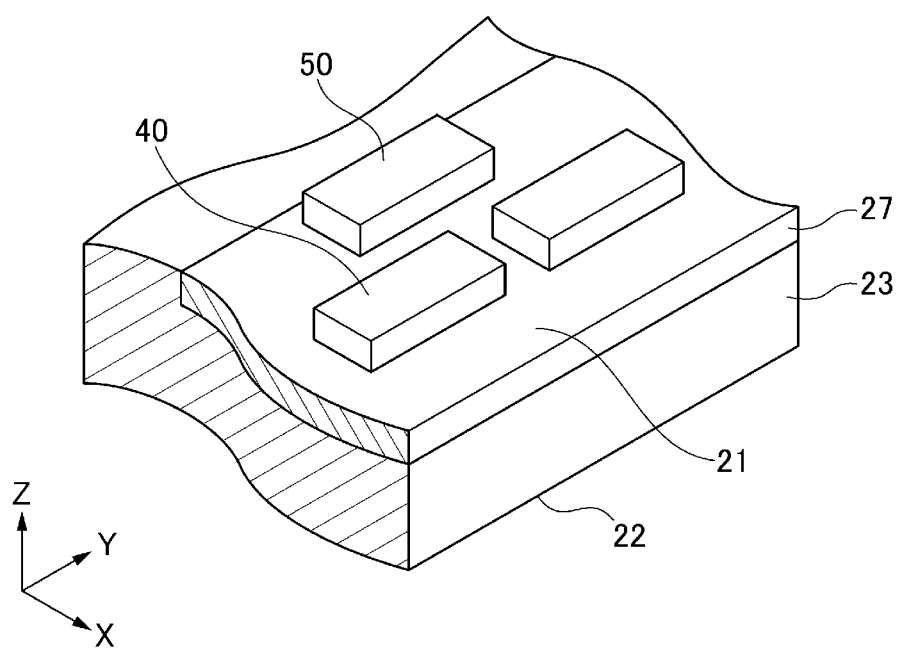
FIG. 2 is a perspective view for explaining an arrangement structure of metals in a semiconductor chip according to an embodiment of the present disclosure.

FIG. 1 is a plan view illustrating an example of the configuration of a semiconductor chip according to an embodiment of the present disclosure. FIG. 2 is a perspective view for explaining an arrangement structure of metals in a semiconductor chip according to an embodiment of the present disclosure. As illustrated in FIG. 1, a semiconductor chip 10 includes, for example, a compound semiconductor substrate 20, a power amplifier circuit 30, a plurality of first metals 40a to 40f, and a plurality of second metals 50a to 50f.

The compound semiconductor substrate 20 is a semi-insulating substrate on which various circuits are formed. As illustrated in FIG. 2, the compound semiconductor substrate 20 has a pair of main surfaces 21 and 22 that is parallel to a plane defined by an X-axis and a Y-axis and that is opposed to each other, and a side surface 23 that is disposed between the pair of main surfaces 21 and 22 and that is parallel to a Z-axis. The pair of main surfaces 21 and 22 forms a substantially rectangular shape in plan view. Each of the main surfaces 21 and 22 has long sides parallel to the X-axis and short sides parallel to the Y-axis. The side surface 23 is a plane along the normal direction of the pair of main surfaces 21 and 22 and surrounds the entire periphery of the pair of main surfaces 21 and 22. FIG. 1 is a plan view of the main surface 21 on which a circuit and the like are formed, the main surface 21 being one of the pair of main surfaces of the compound semiconductor substrate 20.

The material of the compound semiconductor substrate 20 is not particularly limited. The compound semiconductor substrate 20 may be formed of a compound semiconductor such as gallium arsenide (GaAs), silicon-germanium (SiGe), or gallium nitride (GaN).

As illustrated in FIG. 1, the compound semiconductor substrate 20 includes a circuit forming region 24 and an outer circumferential region 25 surrounding the circumference of the circuit forming region 24. The circuit forming region 24 is a substantially rectangular region including a center O in plan view of the main surface 21 of the compound semiconductor substrate 20. The outer circumferential region 25 is a substantially ring-shaped region including an outer edge 26 of the main surface 21.

For example, active elements such as transistors, passive elements such as resistive elements, capacitive elements, and inductance elements, wiring lines, insulating films, and passivation films are formed in the circuit forming region 24. Various circuits are formed by combinations of these active elements, passive elements, wiring lines, and the like. The circuit formed in the circuit forming region 24 is not particularly limited. In the present embodiment, a description will be made on the assumption that a power amplifier circuit 30 described below is formed.

FIG. 3 is a circuit diagram of a power amplifier circuit formed on the compound semiconductor substrate illustrated in FIG. 1. The semiconductor chip 10 including the power amplifier circuit 30 is mounted on, for example, a mobile communication device such as a cellular phone. The power amplifier circuit 30 amplifies a power of a radio-frequency (RF) signal transmitted to a base station. As illustrated in FIG. 3, a power amplifier circuit 30 includes, for example, two amplifiers 110 and 111 and three matching circuits 120 to 122.

The two amplifier 110 (first amplifier) and amplifier 111 (second amplifier) each amplify an input RF signal and output an amplified signal. That is, the power amplifier circuit 30 performs power amplification in two stages. The amplifier 110 in an initial stage (driver stage) amplifies an RF signal RF 1 (first signal) input from an input terminal through the matching circuit 120 and outputs an RF signal RF 2 (second signal). The amplifier 111 in a subsequent-stage (power stage) amplifies the RF signal RF 2 (second signal) input through the matching circuit 121 and outputs an RF signal RF 3 (third signal) through the matching circuit 122. The amplifiers 110 and 111 are each constituted by, for example, a bipolar transistor such as a heterojunction bipolar transistor (HBT). The amplifiers 110 and 111 may be constituted by field-effect transistors (FET) such as metal-oxide-semiconductor field-effect transistors (MOSFET) instead of HBT.

The matching circuit 120 (MN: matching network) performs impedance matching between a circuit (not illustrated) provided in a preceding stage and the amplifier 110. The matching circuit 121 performs impedance matching between the amplifier 110 and the amplifier 111. The matching circuit 122 performs impedance matching between the amplifier 111 and a circuit (not illustrated) provided in a subsequent stage.

Although not illustrated in FIG. 3, the power amplifier circuit 30 may further include, for example, a bias circuit that supplies a bias current or a bias voltage to the amplifiers 110 and 111.

Returning to FIG. 1, in the present embodiment, the driver stage amplifier 110 is formed in a region on the negative direction side of the X-axis in the circuit forming region 24 of the semiconductor chip 10. The power stage amplifier 111 is formed in a region on the positive direction side of the X-axis in the circuit forming region 24 of the semiconductor chip 10. In the circuit forming region 24, for example, an electrode 60 that electrically connects a circuit formed in the circuit forming region 24 to the outside of the semiconductor chip 10 is provided. Among components of the power amplifier circuit 30, components other than the two amplifiers 110 and 111 are not illustrated in FIG. 1. These components may be formed in a remaining region in the circuit forming region 24 or the outer circumferential region 25. Alternatively, the components may be formed outside the semiconductor chip 10.

On the main surface 21 of the semiconductor chip 10 in the outer circumferential region 25 of the main surface 21, a plurality of first metals 40a to 40f and a plurality of second metals 50a to 50f are formed so as to be in contact with the main surface 21. As illustrated in FIG. 2, the semi-insulating compound semiconductor substrate 20 includes, in the outer circumferential region 25 near the main surface 21, an active layer 27 having a ground potential. Each of the plurality of first metals 40a to 40f and the plurality of second metals 50a to 50f is disposed on the active layer 27 in the outer circumferential region 25. The number of metals formed in the outer circumferential region 25 is not particularly limited. In the present embodiment, the number of the first metals and the number of the second metals are each, for example, 6. Hereinafter, in the case where respective metals need not be distinguished from each other, the six first metals 40a to 40f are also referred to as "first metals 40", and the six second metals 50a to 50f are also referred to as "second metals 50". This also applies to first metals to fourth metals according to modifications described below.

In plan view of the main surface 21 of the compound semiconductor substrate 20, the first metals 40 are disposed closer to the outer edge 26 of the main surface 21 than the circuit forming region 24. The six first metals 40a to 40f are arranged substantially in a ring shape so as to surround the power amplifier circuit 30 while gaps are formed between metals adjacent to each other. That is, the number of the first metals is equal to the number of the gaps.

In plan view of the main surface 21 of the compound semiconductor substrate 20, the second metals 50 are positioned between the power amplifier circuit 30 and the first metals 40 so as to be spaced apart from the first metals 40. In plan view of the side surface 23 of the compound semiconductor substrate 20, the six second metals 50 are each arranged so as to cover the corresponding gap between the first metals 40. That is, in plan view of the side surface 23 of the compound semiconductor substrate 20, at least one of the first metals 40 and the second metals 50 is present over the entire circumference on the main surface 21 of the compound semiconductor substrate 20.

In plan view of the main surface 21, the length of each of the first metals 40 along the outer edge 26, the first metals 40 being arranged on an outer side portion, is larger than the length of each of the second metals 50 along the outer edge 26, the second metals 50 being arranged inside the first metals 40. Note that the term "length along the outer edge 26" refers to a length in a direction in which, in plan view of the main surface 21 of the compound semiconductor substrate 20, a side of the main surface 21, the side being closest to the target metal, extends. Hereinafter, the length of a metal along the outer edge 26 is also simply referred to as a "length of a metal".

The material of each of the first metals 40 and the second metals 50 is not particularly limited. For example, the material may be a metal such as Ni, Au, Ge, Ti, W, Pt, or Ta. A ground potential is supplied to the first metals 40 and the second metals 50 through the active layer 27. As a result, the first metals 40 and the second metals 50 function as a so-called sealing ring. The function of the sealing ring will be described with reference to FIGS. 4A and 4B.

Figure 4B:
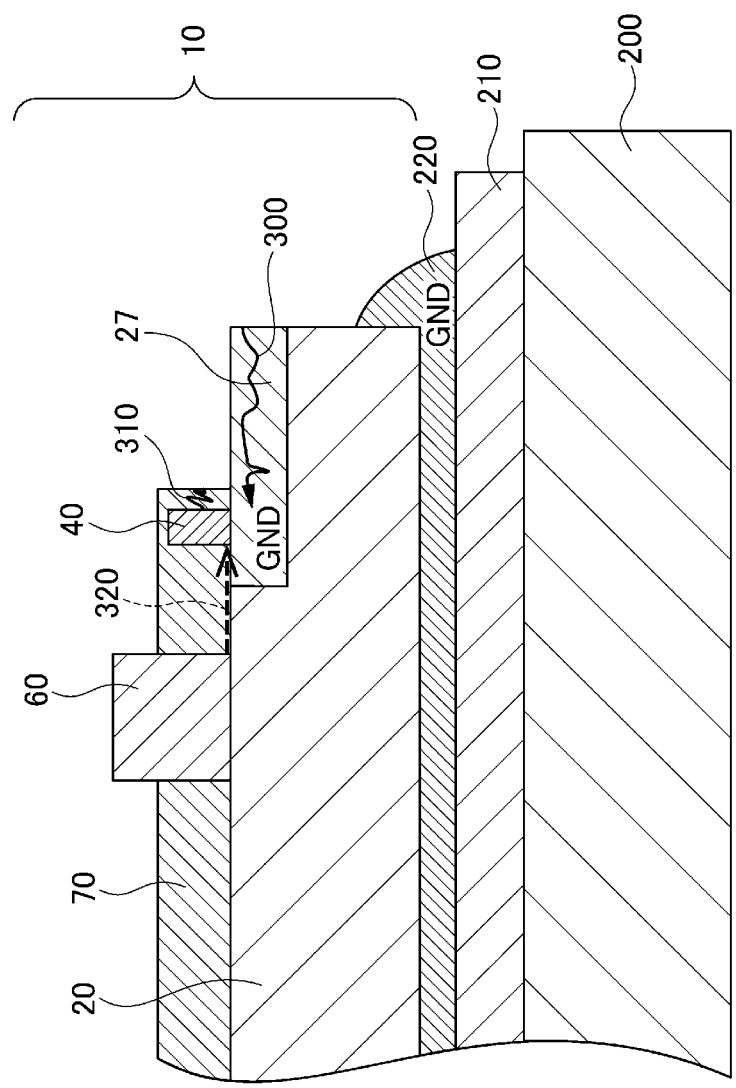
FIG. 4B is a sectional view illustrating the structure of a semiconductor chip according to an embodiment of the present disclosure.

FIGS. 4A and 4B are each a sectional view of a semiconductor chip for explaining the function of a sealing ring. Specifically, FIG. 4A is a sectional view illustrating the structure of a semiconductor chip according to a comparative example, and FIG. 4B is a sectional view illustrating the structure of a semiconductor chip according to an embodiment of the present disclosure. The semiconductor chip according to the comparative example has a configuration in which, in the semiconductor chip 10 according to the present embodiment, the first metals 40 and the second metal 50 are not provided and the compound semiconductor substrate 20 does not include the active layer 27. FIGS. 4A and 4B correspond to the direction of a sectional view taken along line IV-IV of the semiconductor chip 10 illustrated in FIG. 1.

As illustrated in FIG. 4B, a semiconductor chip 10 is disposed on a die pad 210 disposed on an insulating substrate 200 with a bonding paste 220 therebetween. Although not illustrated in FIG. 1, the semiconductor chip 10 further includes a passivation film 70 serving as a protective film deposited so as to cover the surface of a compound semiconductor substrate 20.

As illustrated in FIG. 4A, in a semiconductor chip 10X according to a comparative example, for example, when stress is applied from the outside to a compound semiconductor substrate 20, a microcrack 300 may be formed from the outer edge of the compound semiconductor substrate 20 and may develop to the inside along the surface of the compound semiconductor substrate 20. In addition, when the semiconductor chip 10X is cut into pieces with a dicing machine, a passivation crack 310 may be formed from an end portion of a passivation film 70 by the impact of the dicing. Furthermore, in the case where an electrode 60 disposed near an outer circumferential region of the semiconductor chip 10X has a relatively high potential, a potential difference is generated between the electrode 60 and a bonding paste 220 having a ground potential (refer to an arrow 320 in FIG. 4A). This potential difference may accelerate entry of impurities such as water into the semiconductor chip 10X.

In contrast, as illustrated in FIG. 4B, the semiconductor chip 10 according to the present embodiment includes a first metal 40 that is in contact with a main surface 21 of the compound semiconductor substrate 20 and that is disposed so as to be closer to the outer edge than an electrode 60. With this configuration, even if a microcrack 300 is formed in the compound semiconductor substrate 20 or a passivation crack 310 is formed in the passivation film 70, propagation of the crack is prevented by the first metal 40 to avoid development of the crack to the circuit forming region of the compound semiconductor substrate 20.

In addition, a ground potential is supplied to the first metal 40 through an active layer 27. As a result, even if the electrode 60 has a relatively high potential, the generated potential difference falls within a range between the electrode 60 and the first metal 40 (refer to an arrow 320 in FIG. 4B), and an end portion of the passivation film 70 is maintained at the ground potential. Accordingly, it is possible to suppress entry of impurities into the semiconductor chip 10 due to a potential difference generated at an end portion of the semiconductor chip 10.

In particular, the semiconductor chip 10 according to the present embodiment achieves the following four advantages. First, in the semiconductor chip 10, at least one of the first metals 40 and the second metals 50 is present over the entire circumference on the main surface 21 of the compound semiconductor substrate 20 in plan view of the side surface 23 of the compound semiconductor substrate 20, as described above. With this configuration, development of the cracks and entry of impurities can be suppressed over the entire circumference in plan view of the main surface 21 of the compound semiconductor substrate 20.

Secondly, in the semiconductor chip 10, each of the first metals 40a to 40f is disposed such that at least a part thereof overlaps any of the second metals 50a to 50f in plan view of the side surface 23 of the compound semiconductor substrate 20. That is, in plan view of the side surface 23 of the compound semiconductor substrate 20, at least a part of the first metals 40a to 40f and second metals 50a to 50f overlap with each other. With this configuration, even when a crack is formed not in a direction substantially perpendicular to the outer edge 26 of the main surface 21 of the semiconductor chip 10 but in a direction oblique to the outer edge 26, development of the crack can be prevented.

Thirdly, in the semiconductor chip 10, the length of each of the first metals 40a to 40f arranged on the outside is larger than the length of each of the second metals 50a to 50f arranged on the inside. Furthermore, a circuit may be formed in a part of the outer circumferential region 25, the part not having the first metals 40a to 40f and the second metals 50a to 50f thereon, in addition to the circuit forming region 24 of the compound semiconductor substrate 20. With this configuration, a wide region where a circuit can be formed in the compound semiconductor substrate 20 can be secured compared with a configuration in which the length of a metal arranged on the outside is smaller than the length of a metal arranged on the inside, as illustrated in FIG. 5A, for example. In other words, the chip size can be reduced.

Fourthly, in the semiconductor chip 10, the gap between the first metal 40a and the first metal 40b and the second metal 50a that covers the gap are located on a boundary line L1 along the Y-axis direction and between the driver stage amplifier 110 and the power stage amplifier 111 formed in the circuit forming region 24. Similarly, the gap between the first metal 40c and the first metal 40d and the second metal 50c that covers the gap are also located on the boundary line L1. In addition, the gap between the first metal 40e and the first metal 40f and the second metal 50e that covers the gap are located on a boundary line L2 in the X-axis direction and between the driver stage amplifier 110 and another component (not illustrated) of the power amplifier circuit 30.

Here, when the first metals 40 are disposed so as to surround the main surface 21 of the compound semiconductor substrate 20, for example, an output signal of the driver stage amplifier 110 or an output signal of the power stage amplifier 111 may leak into the other amplifier through the first metals 40, and isolation between the amplifiers may decrease. Regarding this point, in the present embodiment, the decrease in isolation between components can be suppressed by arranging gaps between the first metals 40 near the boundary lines L1 and L2 between the components constituting a circuit.

In the present embodiment, in plan view of the side surface 23 of the compound semiconductor substrate 20, each of the plurality of second metals 50 is disposed so as to cover a gap between the first metals 40. Alternatively, the plurality of second metals need not cover the entire gaps between the first metals. More specifically, in plan view of the side surface 23 of the compound semiconductor substrate 20, each of the plurality of second metals may be disposed such that at least a part thereof overlaps a gap between the first metals. With this configuration, development of the cracks and entry of impurities can be suppressed compared with a configuration in which the second metals are not disposed.

In the present embodiment, the first metals 40 and the second metals 50 are formed on the active layer 27, and a ground potential is supplied to the first metals 40 and the second metals 50 through the active layer 27. However, the configuration for supplying the ground potential to the first metals 40 and the second metals 50 is not limited thereto. For example, the ground potential may be supplied through wiring lines. When the ground potential is supplied through the active layer 27, the size of the semiconductor chip 10 can be reduced compared with the case where wiring lines are used.

The substrate on which the first metals and the second metals are disposed is not limited to a compound semiconductor substrate. Use of a semiconductor substrate such as a silicon wafer can also provide similar advantages.

Figure 5C:
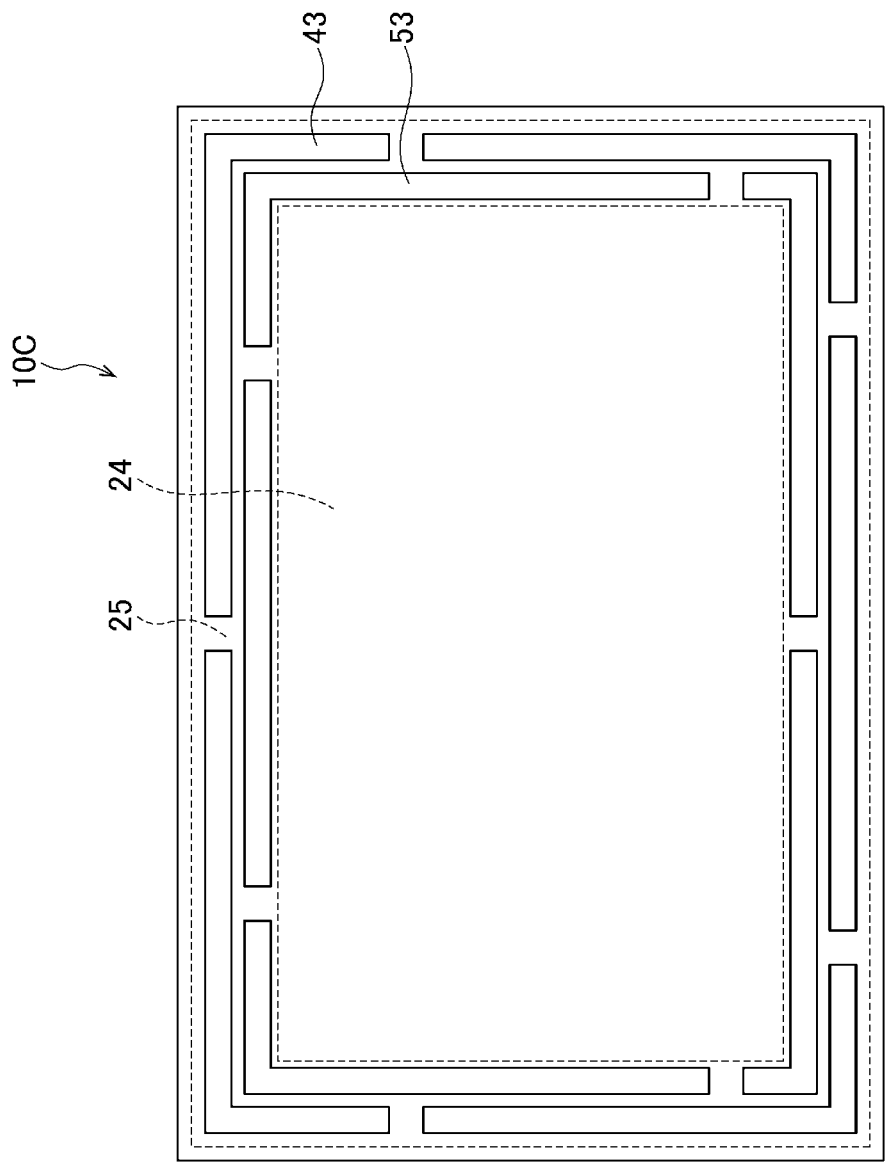
FIG. 5C is a plan view of a semiconductor chip illustrating a modification of the arrangement of metals.

FIGS. 5A to 5C are each a plan view of a semiconductor chip illustrating a modification of the arrangement of metals. In the present modification and the following modifications and embodiments, descriptions of points that are common to those of the embodiment described above will be omitted, and only differences will be described. In particular, the same or similar advantageous effects achieved by the same or similar configuration will not be mentioned in each of the embodiments and the modifications. In FIGS. 5A to 5C, illustrations of components other than first metals and second metals are omitted.

In a semiconductor chip 10A illustrated in FIG. 5A, the relationship between the length of a metal arranged on the outside and the length of a metal arranged on the inside is interchanged with that in the semiconductor chip 10 described above. Specifically, a plurality of second metals 51 according to the present modification are arranged so as to be closer to the outer edge 26 than a plurality of first metals 41. With this configuration, in the semiconductor chip 10A, the length of each of the plurality of second metals 51 disposed on the outside is smaller than the length of each of the plurality of first metals 41 disposed on the inside. In this manner, the relationship between the length of the outside metal and the length of the inside metal is not particularly limited. Furthermore, in plan view of the main surface 21, some or all of the plurality of second metals 51 that cover the gaps between the plurality of first metals 41 may be arranged so as to be positioned between a circuit forming region 24 and the first metals 41 or arranged so as to be closer to the outer edge 26 than the first metals 41.

In a semiconductor chip 10B illustrated in FIG. 5B, the lengths of a plurality of first metals 42 arranged on the outside are substantially equal to the lengths of a plurality of second metals 52 arranged on the inside. In addition, the length of one metal is smaller than each of the lengths of the first metals 40 and second metals 50 in the semiconductor chip 10 illustrated in FIG. 1. In the present modification, as in the first metals 42, the second metals 52 are also arranged substantially in a ring shape so as to surround a circuit while gaps are formed between second metals 52 adjacent to each other. In plan view of the side surface 23 of the compound semiconductor substrate 20, the gaps between the first metals 42 and the gaps between the second metals 52 are arranged so as not to overlap with each other. With this configuration, the advantages similar to those of the semiconductor chip 10 can be achieved.

In a semiconductor chip 10C illustrated in FIG. 5C, the lengths of a plurality of first metals 43 arranged on the outside are substantially equal to the lengths of a plurality of second metals 53 arranged on the inside. In addition, the length of one metal is larger than each of the lengths of the first metals 42 and second metals 52 in the semiconductor chip 10B illustrated in FIG. 5B. In the present modification, as in the first metals 43, the second metals 53 are also arranged so as to surround substantially the entire circumference in plan view of the main surface 21 of the compound semiconductor substrate 20. With this configuration, double metals are formed so as to surround substantially the entire circumference in plan view of the main surface 21 of the compound semiconductor substrate 20. Therefore, development of cracks and entry of impurities can be effectively prevented compared with the semiconductor chips 10, 10A, and 10B.

FIGS. 6A to 6D are each a perspective view of a semiconductor chip illustrating a modification of a layered structure of metals. FIGS. 6A to 6D each illustrate a semiconductor chip viewed from the same direction as the direction of the perspective view illustrated in FIG. 2.

Figure 6A:
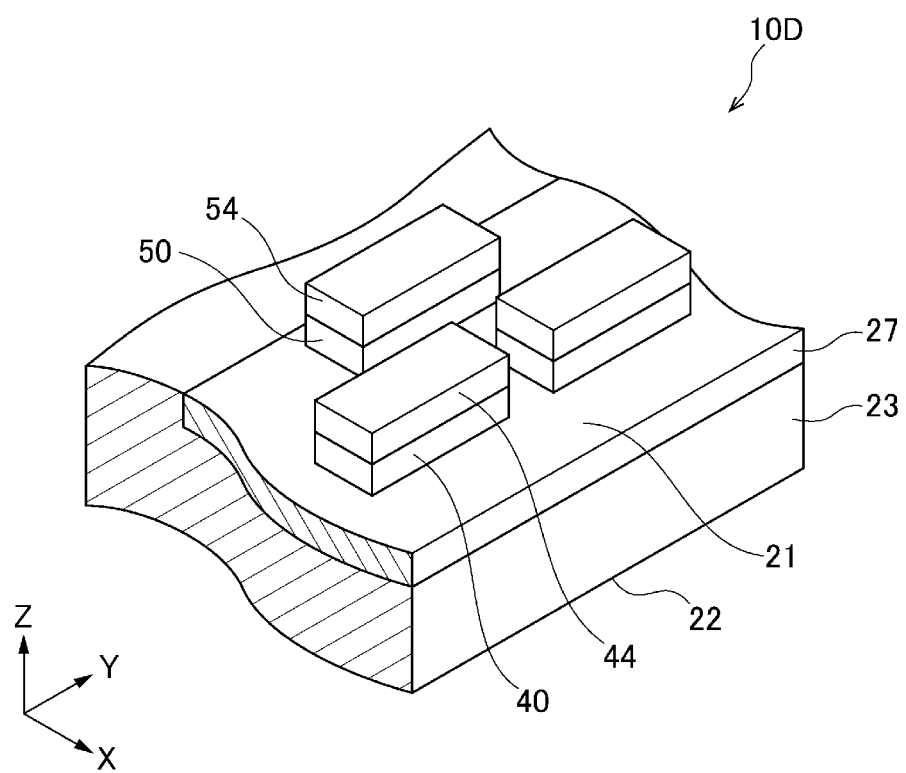
FIG. 6A is a perspective view of a semiconductor chip illustrating a modification of the layered structure of metals.

A semiconductor chip 10D illustrated in FIG. 6A differs from the semiconductor chip 10 illustrated in FIG. 2 in that metals each have a two-layer structure. Specifically, the semiconductor chip 10D further includes a third metal 44 stacked on a first metal 40 and a fourth metal 54 stacked on a second metal 50. The materials of the third metal 44 and the fourth metal 54 may be the same as or different from the materials of the first metal 40 and the second metal 50, respectively. Two metal layers are stacked in the present modification. Alternatively, three or more metal layers may be stacked.

Figure 6B:
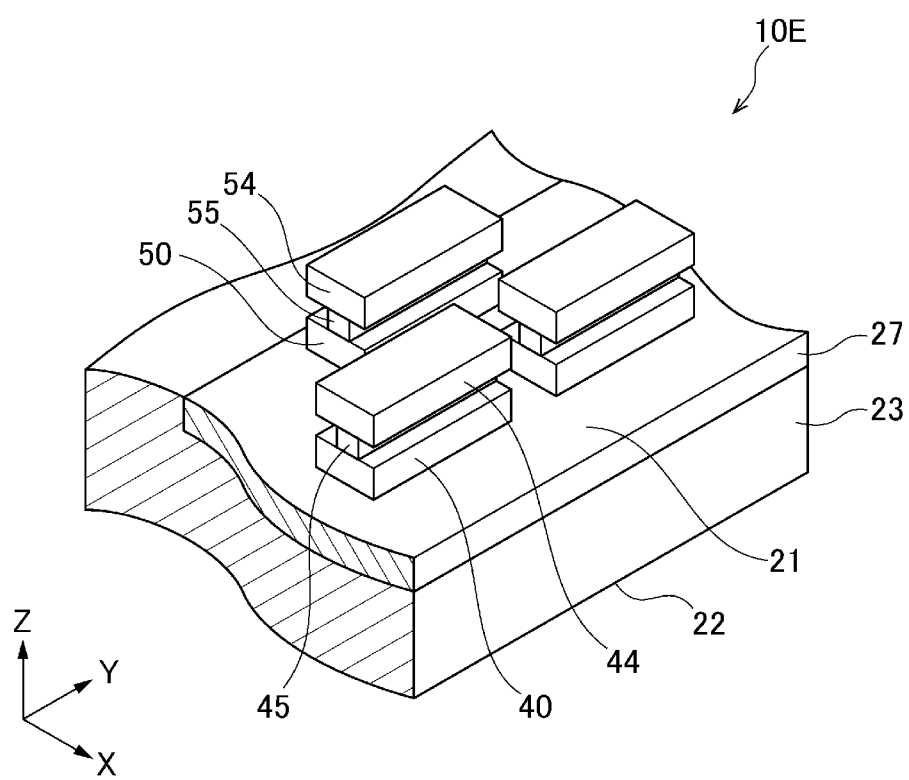
FIG. 6B is a perspective view of a semiconductor chip illustrating a modification of the layered structure of metals.

A semiconductor chip 10E illustrated in FIG. 6B differs from the semiconductor chip 10D illustrated in FIG. 6A in that the semiconductor chip 10E further includes a via electrode 45 between a first metal 40 and a third metal 44 and a via electrode 55 between a second metal 50 and a fourth metal 54. The via electrodes 45 and 55 have lengths equal to those of the first metal 40 and the second metal 50 and widths smaller than those of the first metal 40 and the second metal 50, respectively. In this manner, the metals that are stacked may be electrically connected to each other with a via electrode therebetween. With this configuration, a potential (for example, ground potential) that is equal to a potential of the metal of the lower layer is supplied to the metal of the upper layer.

Figure 6C:
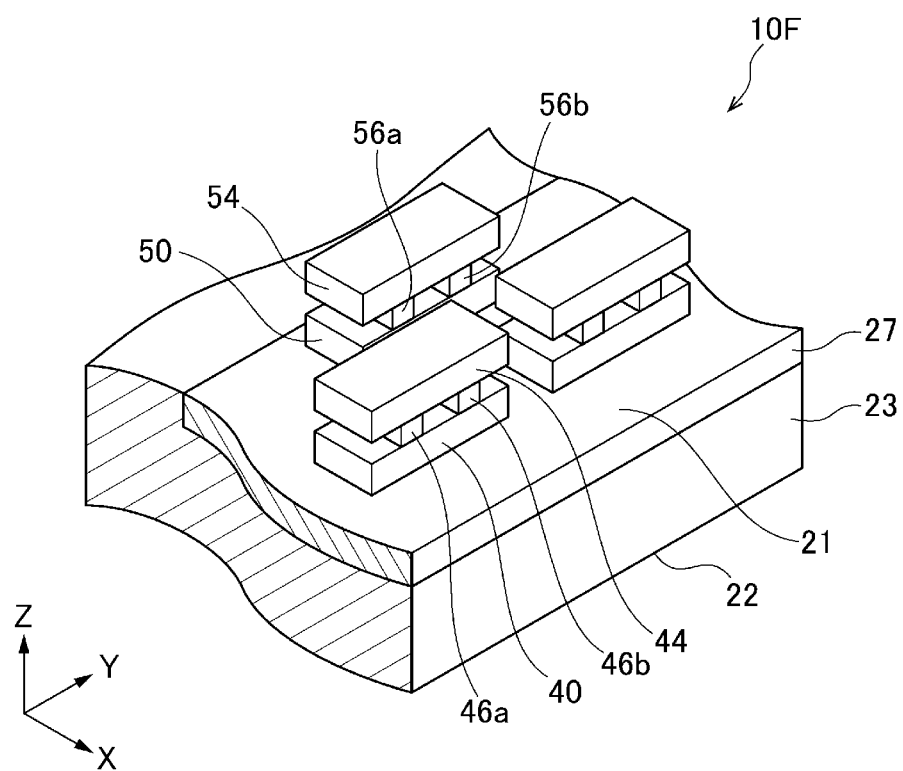
FIG. 6C is a perspective view of a semiconductor chip illustrating a modification of the layered structure of metals.

A semiconductor chip 10F illustrated in FIG. 6C differs from the semiconductor chip 10E illustrated in FIG. 6B in that the semiconductor chip 10F includes two via electrodes 46a and 46b and two via electrodes 56a and 56b instead of the via electrode 45 and the via electrode 55, respectively. The two via electrodes 46a and 46b are disposed between a first metal 40 and a third metal 44. The two via electrodes 56a and 56b are disposed between a second metal 50 and a fourth metal 54. Thus, the shape of the via electrode disposed between the metal of the lower layer and the metal of the upper layer is not particularly limited.

Figure 6D:
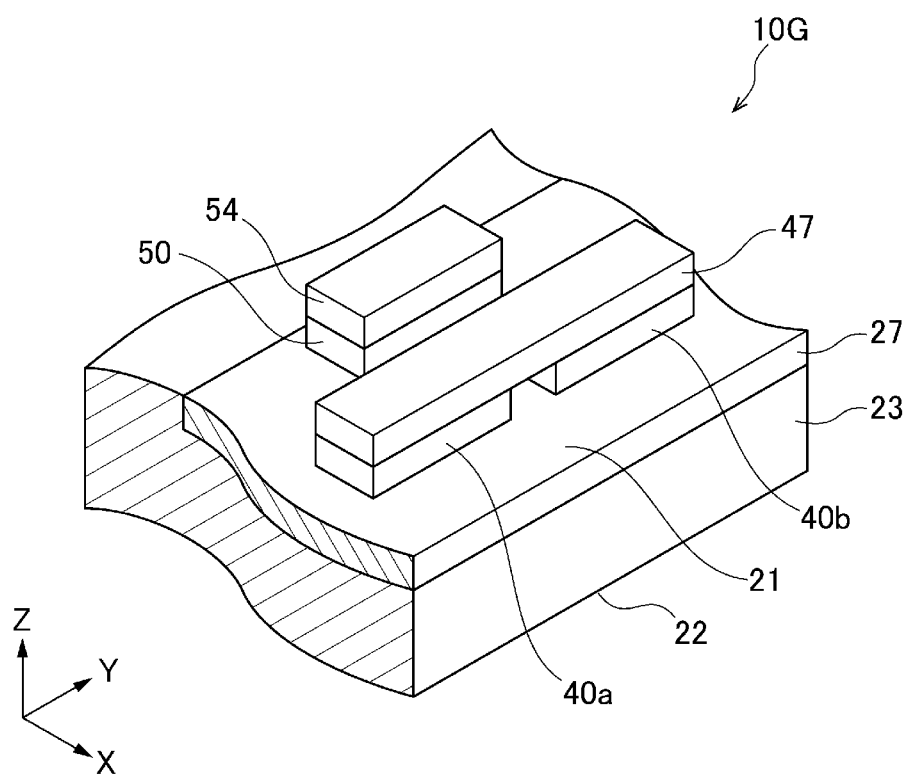
FIG. 6D is a perspective view of a semiconductor chip illustrating a modification of the layered structure of metals.

A semiconductor chip 10G illustrated in FIG. 6D differs from the semiconductor chip 10D illustrated in FIG. 6A in that the semiconductor chip 10G includes a third metal 47 instead of the third metal 44. The third metal 47 is stacked so as to extend over a first metal 40a and a first metal 40b that are adjacent to each other. In this manner, the metal of the upper layer stacked on the metal of the lower layer need not be disposed in a one-to-one correspondence with the metal of the lower layer. The metal of the upper layer may be stacked so as to extend over three or more metals of the lower layer. Alternatively, two or more metals of the upper layer may be stacked on one metal of the lower layer.

Next, mounting structures of a semiconductor chip on an insulating substrate will be described with reference to FIGS. 7A and 7B. The insulating substrate is not particularly limited and may be, for example, a printed circuit board (PCB).

FIG. 7A is a sectional view illustrating a structure in which a semiconductor chip according to an embodiment of the present disclosure is mounted on an insulating substrate with a wire-bonding structure. FIG. 7B is a sectional view illustrating a structure in which a semiconductor chip according to an embodiment of the present disclosure is mounted on an insulating substrate with a flip-chip structure. Among components illustrated in FIGS. 7A and 7B, components corresponding to the components illustrated in FIG. 4B are denoted by like reference numerals, and a description thereof will be omitted.

In the wire-bonding structure as illustrated in FIG. 7A, a semiconductor chip 10 is mounted on an insulating substrate 200 such that a main surface 22 of a compound semiconductor substrate 20 faces the insulating substrate 200. An electrode 60 exposed from a passivation film 70 of the semiconductor chip 10 and an electrode 230 disposed on the insulating substrate 200 are electrically connected to each other through a wire 400.

On the other hand, in the flip-chip structure as illustrated in FIG. 7B, a semiconductor chip 10H is mounted on an insulating substrate 200 such that a main surface 21 of a compound semiconductor substrate 20 faces the insulating substrate 200. Bumps 80a and 80b exposed from a passivation film 70 of the semiconductor chip 10H are electrically connected to electrodes (not illustrated) disposed on a die pad 210 on the insulating substrate 200.

The semiconductor chip 10H differs from the semiconductor chip 10 in that the semiconductor chip 10H further includes a ground potential layer 90. The ground potential layer 90 is disposed on a main surface 22 of the compound semiconductor substrate 20, the main surface 22 not having a circuit and the like thereon, and a ground potential is supplied to the ground potential layer 90. With this configuration, a shielding effect of the semiconductor chip 10H is enhanced, and the effect of noise and the like from the outside can be reduced. Note that this does not exclude a configuration in which the ground potential layer 90 is not disposed on the compound semiconductor substrate 20 from the semiconductor chip according to the present embodiment.

Exemplary embodiments of the present disclosure have been described. The semiconductor chips 10 and 10A to 10H each include a compound semiconductor substrate 20 having a pair of main surfaces 21 and 22 and a side surface 23 disposed between the pair of main surfaces; a circuit disposed on a main surface 21 which is one of the pair of main surfaces; a plurality of first metals 40 to 43 disposed on the main surface 21; and a plurality of second metals 50 to 53 disposed on the main surface 21. In plan view of the main surface 21, the plurality of first metals 40 to 43 are arranged, so as to be closer to an outer edge 26 of the main surface 21 than the circuit, substantially in a ring shape so as to surround the circuit while gaps are formed between first metals that are adjacent to each other. In plan view of the main surface 21, the plurality of second metals 50 to 53 are arranged so as to be positioned between the circuit and the plurality of first metals or so as to be closer to the outer edge 26 than the plurality of first metals. In plan view of the side surface 23 of the compound semiconductor substrate 20, each of the plurality of second metals 50 to 53 is disposed such that at least a part of the second metal overlaps any of the gaps between the first metals 40 to 43. With this configuration, in plan view of the side surface 23 of the compound semiconductor substrate 20, at least a part of each of the second metals 50 to 53 is disposed in any of the gaps between the first metals 40 to 43. Therefore, development of cracks and entry of impurities can be suppressed.

In the semiconductor chips 10 and 10A to 10H, in plan view of the side surface 23 of the compound semiconductor substrate 20, the plurality of second metals 50 to 53 are each arranged so as to cover gaps between the first metals 40 to 43. With this configuration, in plan view of the side surface 23 of the compound semiconductor substrate 20, at least one of the first metals 40 to 43 and the second metals 50 to 53 is present on the main surface 21. Accordingly, development of cracks and entry of impurities can be further suppressed.

In the semiconductor chips 10 and 10A to 10H, in plan view of the side surface 23 of the compound semiconductor substrate 20, each of the plurality of first metals 40 to 43 is disposed such that at least a part thereof overlaps any of the plurality of second metals 50 to 53. With this configuration, even when a crack is formed in an oblique direction, development of the crack can be prevented.

In the semiconductor chip 10, the plurality of second metals 50 are positioned between a circuit and the plurality of first metals 40 in plan view of one main surface 21. In addition, the length of each of the plurality of first metals 40 along the outer edge 26 of the main surface 21 is larger than the length of each of the plurality of second metals 50 along the outer edge 26 of the main surface 21. With this configuration, it is possible to secure a wide region where a circuit can be formed compared with the configuration in which the length of a metal arranged on the outside is smaller than the length of a metal arranged on the inside. Therefore, the chip size can be reduced.

In the semiconductor chips 10 and 10A to 10H, the plurality of first metals 40 to 43 and the plurality of second metals 50 to 53 are each disposed on the active layer 27 of the compound semiconductor substrate 20, and a ground potential is supplied to the first metals 40 to 43 and the second metals 50 to 53 through the active layer 27. With this configuration, the size of the semiconductor chip can be reduced compared with the case where wiring lines are used.

The power amplifier circuit 30 formed on the semiconductor chip 10 includes the first amplifier 110 that amplifies a first signal and outputs a second signal and the second simplifier 111 that amplifies the second signal and outputs a third signal. At least one of gaps between the first metals is disposed on the boundary line L1 between the first amplifier 110 and the second amplifier 111 in plan view of the main surface 21. With this configuration, a decrease in isolation between components can be suppressed.

The semiconductor chip 10H further includes a ground potential layer 90 disposed on the other main surface 22 of the pair of main surfaces of the compound semiconductor substrate 20. The compound semiconductor substrate 20 is joined to the insulating substrate 200 with a flip-chip structure such that the one main surface 21 faces the insulating substrate 200. With this configuration, a shielding effect of the semiconductor chip 10H is enhanced, and the effect of noise and the like can be reduced.

The embodiments described above are provided for facilitating the understanding of the present disclosure and are not intended to restrict the interpretation of the present disclosure. The present disclosure can be changed or improved without departing from the spirit thereof and encompasses equivalents thereof. That is, suitable design changes made to the embodiments by those skilled in the art are also encompassed within the scope of the present disclosure as long as they have features of the present disclosure. For example, arrangements, materials, conditions, shapes, and sizes of the components in the embodiments are not limited to those illustrated exemplarily and may be changed as appropriate. The components in the embodiments may be combined in a technically possible manner, and configurations obtained by combining the components in the embodiments are also encompassed within the scope of the present disclosure as long as they have features of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor chip comprising:
   a compound semiconductor substrate having first and second main surfaces and a side surface between the first and second main surfaces;
   a circuit on the first main surface;
   a plurality of first metals on the first main surface, the plurality of first metals being positioned, in plan view of the first main surface, closer to an outer edge of the first main surface than the circuit, substantially in a ring shape to surround the circuit with gaps between first metals that are adjacent to each other; and
   a plurality of second metals on the first main surface, the plurality of second metals being positioned, in plan view of the first main surface, between the circuit and the plurality of first metals or closer to the outer edge than the plurality of first metals, and the plurality of second metals being positioned, in plan view of the side surface of the compound semiconductor substrate, such that at least a part of each of the second metals overlaps a respective one of the gaps between the first metals.

2. The semiconductor chip according to claim 1, wherein in plan view of the side surface of the compound semiconductor substrate, each of the second metals covers a respective one of the gaps between the first metals.

3. The semiconductor chip according to claim 2, wherein in plan view of the side surface of the compound semiconductor substrate, at least a part of each of the first metals overlaps any of the second metals.

4. The semiconductor chip according to claim 2, wherein in plan view of the first main surface, the plurality of second metals are positioned between the circuit and the plurality of first metals, and
   a length of each of the first metals along the outer edge of the first main surface is larger than a length of each of the second metals along the outer edge of the first main surface.

5. The semiconductor chip according to claim 2, further comprising:
   a third metal on the plurality of first metals, such that the third metal extends over two of the first metals that are adjacent to each other.

6. The semiconductor chip according to claim 2, wherein the compound semiconductor substrate includes an active layer,
   the plurality of first metals and the plurality of second metals are on the active layer, and
   the active layer is configured to supply a ground potential to the first metals and the second metals through the active layer.

7. The semiconductor chip according to claim 2, wherein the circuit includes a power amplifier circuit, the power amplifier circuit includes
   a first amplifier configured to amplify a first signal and output a second signal, and
   a second amplifier configured to amplify the second signal and output a third signal, and
   at least one of the gaps between the first metals is disposed on a boundary line between the first amplifier and the second amplifier in plan view of the first main surface.

8. The semiconductor chip according to claim 2, further comprising:
   a ground potential layer on the second main surface of the compound semiconductor substrate,
   wherein the compound semiconductor substrate is configured to join to an insulating substrate with a flip-chip structure such that the first main surface faces the insulating substrate.

9. The semiconductor chip according to claim 1, wherein in plan view of the side surface of the compound semiconductor substrate, at least a part of each of the first metals overlaps any of the second metals.

10. The semiconductor chip according to claim 9, wherein in plan view of the first main surface, the plurality of second metals are positioned between the circuit and the plurality of first metals, and
    a length of each of the first metals along the outer edge of the first main surface is larger than a length of each of the second metals along the outer edge of the first main surface.

11. The semiconductor chip according to claim 9, further comprising:
    a third metal on the plurality of first metals, such that the third metal extends over two of the first metals that are adjacent to each other.

12. The semiconductor chip according to claim 9, wherein the compound semiconductor substrate includes an active layer,
    the plurality of first metals and the plurality of second metals are on the active layer, and the active layer is configured to supply a ground potential to the first metals and the second metals through the active layer.

13. The semiconductor chip according to claim 9, wherein the circuit includes a power amplifier circuit, the power amplifier circuit includes
a first amplifier configured to amplify a first signal and output a second signal, and
a second amplifier configured to amplify the second signal and output a third signal, and
at least one of the gaps between the first metals is disposed on a boundary line between the first amplifier and the second amplifier in plan view of the first main surface.

14. The semiconductor chip according to claim 9, further comprising:
a ground potential layer on the second main surface of the compound semiconductor substrate,
wherein the compound semiconductor substrate is configured to join to an insulating substrate with a flip-chip structure such that the first main surface faces the insulating substrate.

15. The semiconductor chip according to claim 1, wherein
in plan view of the first main surface, the plurality of second metals are positioned between the circuit and the plurality of first metals, and
a length of each of the first metals along the outer edge of the first main surface is larger than a length of each of the second metals along the outer edge of the first main surface.

16. The semiconductor chip according to claim 15, further comprising:
a third metal on the plurality of first metals, such that the third metal extends over two of the first metals that are adjacent to each other.

17. The semiconductor chip according to claim 1, further comprising:
a third metal on the plurality of first metals, such that the third metal extends over two of the first metals that are adjacent to each other.

18. The semiconductor chip according to claim 1, wherein
the compound semiconductor substrate includes an active layer,
the plurality of first metals and the plurality of second metals are on the active layer, and
the active layer is configured to supply a ground potential to the first metals and the second metals through the active layer.

19. The semiconductor chip according to claim 1, wherein the circuit includes a power amplifier circuit, the power amplifier circuit includes
a first amplifier configured to amplify a first signal and output a second signal, and
a second amplifier configured to amplify the second signal and output a third signal, and
at least one of the gaps between the first metals is disposed on a boundary line between the first amplifier and the second amplifier in plan view of the first main surface.

20. The semiconductor chip according to claim 1, further comprising:
a ground potential layer on the second main surface of the compound semiconductor substrate,
wherein the compound semiconductor substrate is configured to join to an insulating substrate with a flip-chip structure such that the first main surface faces the insulating substrate.

* * * * *